US009822284B2

(12) United States Patent
Usugi et al.

(10) Patent No.: US 9,822,284 B2
(45) Date of Patent: Nov. 21, 2017

(54) ADHESIVE FILM AND METHOD FOR MANUFACTURING SEMICONDUCTOR DEVICE

(71) Applicant: MITSUI CHEMICALS TOHCELLO, INC., Chiyoda-ku, Tokyo (JP)

(72) Inventors: Shinichi Usugi, Chiba (JP); Kouji Igarashi, Tokai (JP); Akimitsu Morimoto, Nagoya (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 0 days.

(21) Appl. No.: 14/915,587

(22) PCT Filed: Aug. 21, 2014

(86) PCT No.: PCT/JP2014/071891
§ 371 (c)(1),
(2) Date: Feb. 29, 2016

(87) PCT Pub. No.: WO2015/029871
PCT Pub. Date: Mar. 5, 2015

(65) Prior Publication Data
US 2016/0208144 A1 Jul. 21, 2016

(30) Foreign Application Priority Data

Aug. 29, 2013 (JP) .................................. 2013-178515

(51) Int. Cl.
*H01L 21/56* (2006.01)
*H01L 21/67* (2006.01)
(Continued)

(52) U.S. Cl.
CPC ............. *C09J 7/0285* (2013.01); *B32B 3/085* (2013.01); *B32B 7/12* (2013.01); *B32B 25/12* (2013.01);
(Continued)

(58) Field of Classification Search
CPC ....... H01L 21/561; H01L 21/67; H01L 23/29; H01L 24/26
(Continued)

(56) References Cited

U.S. PATENT DOCUMENTS 6,700,185 B1    3/2004  Kawai et al.
7,057,266 B2    6/2006  Kawai et al.
(Continued)

FOREIGN PATENT DOCUMENTS

CN    102134453 A    7/2011
CN    102549094 A    7/2012
(Continued)

OTHER PUBLICATIONS

International Search Report (PCT/ISA/210) dated Nov. 25, 2014, by the Japanese Patent Office as the International Searching Authority for International Application No. PCT/JP2014/071891.
(Continued)

*Primary Examiner* — Moazzam Hossain
*Assistant Examiner* — Omar Mojaddedi
(74) *Attorney, Agent, or Firm* — Buchanan, Ingersoll & Rooney PC

(57) ABSTRACT

An adhesive film of the present invention includes a base material layer and a self-peeling adhesive layer laminated therein. The base material layer has a thermal contraction percentage in a direction of flow (thermal contraction percentage in an MD direction) and a thermal contraction percentage in an orthogonal direction with respect to the direction of flow (thermal contraction percentage in a TD direction) that satisfy the following conditions: (1) after heating at 150° C. for 30 minutes, 0.4≤|thermal contraction percentage in MD direction/thermal contraction percentage in TD direction|≤2.5 and average of thermal contraction percentage in MD direction and thermal contraction per-
(Continued)

centage in TD direction≤2%, and (2) after heating at 200° C. for 10 minutes, 0.4≤|thermal contraction percentage in MD direction/thermal contraction percentage in TD direction|≤2.5 and average of thermal contraction percentage in MD direction and thermal contraction percentage in TD direction≥3%.

10 Claims, 4 Drawing Sheets

(51) Int. Cl.
| | |
|---|---|
| H01L 23/29 | (2006.01) |
| C09J 7/02 | (2006.01) |
| C09J 201/00 | (2006.01) |
| H01L 23/00 | (2006.01) |
| B32B 7/12 | (2006.01) |
| B32B 27/06 | (2006.01) |
| B32B 27/28 | (2006.01) |
| B32B 27/34 | (2006.01) |
| B32B 27/36 | (2006.01) |
| B32B 3/08 | (2006.01) |
| H01L 21/683 | (2006.01) |
| B32B 25/12 | (2006.01) |
| B32B 25/18 | (2006.01) |
| B32B 27/18 | (2006.01) |
| B32B 27/08 | (2006.01) |

(52) U.S. Cl.
CPC .............. *B32B 25/18* (2013.01); *B32B 27/06* (2013.01); *B32B 27/08* (2013.01); *B32B 27/18* (2013.01); *B32B 27/281* (2013.01); *B32B 27/34* (2013.01); *B32B 27/36* (2013.01); *C09J 7/02* (2013.01); *C09J 7/0217* (2013.01); *C09J 201/00* (2013.01); *H01L 21/565* (2013.01); *H01L 21/6835* (2013.01); *H01L 24/19* (2013.01); *H01L 24/26* (2013.01); *H01L 24/96* (2013.01); *B32B 2307/306* (2013.01); *B32B 2307/736* (2013.01); *B32B 2307/748* (2013.01); *B32B 2405/00* (2013.01); *B32B 2457/00* (2013.01); *B32B 2457/14* (2013.01); *C09J 2201/134* (2013.01); *C09J 2201/606* (2013.01); *C09J 2203/326* (2013.01); *C09J 2433/00* (2013.01); *C09J 2467/006* (2013.01); *C09J 2477/006* (2013.01); *C09J 2479/086* (2013.01); *H01L 21/561* (2013.01); *H01L 21/568* (2013.01); *H01L 2221/68381* (2013.01); *H01L 2224/12105* (2013.01); *H01L 2924/15788* (2013.01); *H01L 2924/181* (2013.01); *H01L 2924/3511* (2013.01)

(58) Field of Classification Search
USPC ........................................................ 438/118
See application file for complete search history.

(56) References Cited

U.S. PATENT DOCUMENTS

| | | |
|---|---|---|
| 7,378,722 B2 | 5/2008 | Kawai et al. |
| 7,479,412 B2 | 1/2009 | Kawai et al. |
| 7,910,206 B2 | 3/2011 | Kiuchi et al. |
| 8,999,503 B2 | 4/2015 | Takahira et al. |
| 2004/0124544 A1 | 7/2004 | Kawai et al. |
| 2006/0138616 A1 | 6/2006 | Kawai et al. |
| 2008/0131634 A1 | 6/2008 | Kiuchi et al. |
| 2008/0194062 A1 | 8/2008 | Kawai et al. |
| 2010/0198419 A1 | 8/2010 | Sonoda et al. |
| 2011/0151625 A1 | 6/2011 | Hoshino et al. |
| 2011/0237050 A1 | 9/2011 | Sugimura et al. |
| 2012/0208015 A1 | 8/2012 | Takahira et al. |
| 2013/0029147 A1 | 1/2013 | Miki et al. |
| 2013/0244377 A1* | 9/2013 | Arimitsu ................ H01L 24/96 438/118 |
| 2014/0322474 A1 | 10/2014 | Usugi et al. |
| 2015/0151474 A1* | 6/2015 | Brennan ............... C08G 63/914 525/437 |

FOREIGN PATENT DOCUMENTS

| | | |
|---|---|---|
| JP | 2000-319600 A | 11/2000 |
| JP | 2003-017647 A | 1/2003 |
| JP | 2008-155619 A | 7/2008 |
| JP | 2009-114956 A | 5/2009 |
| JP | 2009-132867 A | 6/2009 |
| JP | 2011-088959 A | 5/2011 |
| JP | 2011-204806 A | 10/2011 |
| JP | 2012-012506 A | 1/2012 |
| JP | 2012-167178 A | 9/2012 |
| JP | 2013-047321 A | 3/2013 |
| WO | WO 00/62338 A1 | 10/2000 |
| WO | WO 2011/049116 A1 | 4/2011 |
| WO | WO 2013/088686 A1 | 6/2013 |
| WO | WO 2013/114956 A1 | 8/2013 |
| WO | WO 2014/142192 A1 | 9/2014 |

OTHER PUBLICATIONS

Written Opinion (PCT/ISA/237) dated Nov. 25, 2014, by the Japanese Patent Office as the International Searching Authority for International Application No. PCT/JP2014/071891.
Office Action issued by the Japanese Patent Office in corresponding Japanese Patent Application No. 2015-534168 dated Aug. 23, 2016 (2 pages).
Office Action issued by the Korean Patent Office in corresponding Korean Patent Application No. 10-2016-7004674 dated Feb. 1, 2017 (11 pages including partial English translation).
Decision to Grant a Patent issued by the Japanese Patent Office in corresponding Japanese Patent Application No. 2015-534168 dated Apr. 4, 2017 (3 pages including partial English translation).
The First Office Action issued by the State Intellectual Property Office of People's Republic of China in corresponding Chinese Patent Application No. 201480047307.5 dated Apr. 10, 2017 (20 pages including partial English translation).

* cited by examiner

ADHESIVE FILM AND METHOD FOR MANUFACTURING SEMICONDUCTOR DEVICE

TECHNICAL FIELD

The present invention relates to an adhesive film and to a method for manufacturing a semiconductor device using the adhesive film.

BACKGROUND ART

There is an increasing demand for reducing the size of mounted components, and more importance is being placed on a technology capable of decreasing the size of a package and, thus, capable of reducing the size and weight of a semiconductor device.

Such a technology which has been developed is wafer-level packaging (WLP). In WLP, interconnects and electrodes of a circuit are provided on a semiconductor wafer, and encapsulated with a resin, and then, dicing of the semiconductor wafer is performed. Furthermore, high-density integration, more external connections, and the like have been required in recent years, and in order to satisfy such conditions, embedded waver-level ball grid array (eWLB) has been developed.

This method for manufacturing a package utilizes a technique that includes adhering a semiconductor chip onto a supporting substrate using an adhesive film and encapsulating the semiconductor chip.

The adhesive film, however, is required to fix the semiconductor chip onto the supporting substrate during an encapsulating step or the like and, on the contrary, is required to be removed along with the supporting substrate from the semiconductor chip after encapsulating. As such, the adhesive film is required to have contrary characteristics.

In Patent Document 1, there is disclosed a thermally contractible film in which an adhesive layer is laminated on both surfaces of a base material, wherein the thermally contractible film has a high contraction percentage under a temperature of 100° C. or less.

In Patent Document 2, there are disclosed a semiconductor adhesive film in which a resin layer A is laminated on one or both sides of a supporting film and a method that includes adhering the semiconductor adhesive film, having a coefficient of linear thermal expansion of $3.0 \times 10^{-5}/°$ C. at a temperature of 20° C. to 200° C., to a rear side of a lead frame to protect the lead frame with the supporting film and peeling the semiconductor adhesive film off after encapsulating. This supporting film is described as having a thermal contraction percentage of 0.15% or less when being heated at a temperature of 200° C. for two hours.

In Patent Document 3, there is disclosed a laminated sheet in which a contractible film layer and a constraining layer which constrains contraction of the contractible film layer are laminated. The contractible film layer is described as having a thermal contraction percentage of 30% to 90% at a temperature of 70° C. to 180° C. in the direction of main contraction.

In Patent Document 4, there is disclosed a dicing surface protecting sheet that uses a thermally contractible film having a thermal contraction percentage of 3% to 90% in the temperature range of 40° C. to 180° C. A processing method using this dicing surface protecting sheet is also described therein. However, Patent Document 4 does not describe using the dicing surface protecting sheet in a step of resin molding.

In Patent Document 5, there is disclosed a heat-peeled adhesive sheet in which a thermally expandable adhesive layer containing a foaming agent is laminated on at least one side of a base material that includes a composite film layer of a urethane polymer (meta) and an acrylic polymer. The heat-peeled adhesive sheet is described as having a thermal contraction percentage of 97% or greater at a temperature of 150° C.

RELATED DOCUMENT

Patent Document

[Patent Document 1] Japanese Unexamined Patent Publication No. 2000-319600

[Patent Document 2] Japanese Unexamined Patent Publication No. 2003-17647

[Patent Document 3] Japanese Unexamined Patent Publication No. 2008-155619

[Patent Document 4] Japanese Unexamined Patent Publication No. 2011-204806

[Patent Document 5] Japanese Unexamined Patent Publication No. 2012-167178

SUMMARY OF THE INVENTION

The adhesive films described in Patent Documents 1 to 5, however, do not have contrary characteristics such as having thermal tolerance and adhesiveness at the temperature of mounting and resin molding steps and exhibiting easy peelability in a step of peeling a semiconductor chip off from a supporting body after the resin molding. Thus, the adhesive films cannot be used in a semiconductor manufacturing process such as the eWLB technology that requires such characteristics to be provided.

The present invention, conceived in view of the above situation, provides an adhesive film having characteristics as above and further provides a method for manufacturing a semiconductor device using the adhesive film.

The present invention is described as follows.

[1] An adhesive film in which a base material layer and a self-peeling adhesive layer are laminated, wherein the base material layer has a thermal contraction percentage in a direction of flow (thermal contraction percentage in an MD direction) and a thermal contraction percentage in an orthogonal direction with respect to the direction of flow (thermal contraction percentage in a TD direction) that satisfy the following conditions:

(1) after heating at 150° C. for 30 minutes, 0.4≤|thermal contraction percentage in MD direction/thermal contraction percentage in TD direction|≤2.5 and average of thermal contraction percentage in MD direction and thermal contraction percentage in TD direction≥2%, and (2) after heating at 200° C. for 10 minutes, 0.4≤|thermal contraction percentage in MD direction/thermal contraction percentage in TD direction|≤2.5 and average of thermal contraction percentage in MD direction and thermal contraction percentage in TD direction≥3%.

[2] The adhesive film according to [1], wherein the self-peeling adhesive layer has an adhesive strength that is decreased by heat.

[3] The adhesive film according to [1] or [2], wherein the adhesive film further comprises an adhesive layer, and the adhesive layer is laminated on the base material layer on a side opposite to the side on which the self-peeling adhesive layer is laminated.

[4] The adhesive film according to any one of [1] to [3], wherein the base material layer has a storage modulus E' at 180° C. of greater than or equal to 1.0E+6 and less than or equal to 2.0E+8.

[5] The adhesive film according to any one of [1] to [4], wherein the base material layer comprises a polyester resin, a polyimide resin, or a polyamide resin.

[6] A method for manufacturing a semiconductor device comprising the steps of:

adhering the adhesive film according to any one of [1] to [5] to a supporting substrate such that the self-peeling adhesive layer is on the supporting substrate side of the adhesive film;

mounting a semiconductor chip on the base material layer of the adhesive film;

applying an encapsulating material to cover the semiconductor chip and the adhesive film and curing the encapsulating material at a temperature of 150° C. or less to form a semiconductor chip mold with an attached supporting base material;

heating at a temperature over 150° C. to decrease an adhesive strength of the self-peeling adhesive layer and removing the supporting substrate from the semiconductor chip mold with an attached supporting base material; and removing the adhesive film to obtain a semiconductor chip mold.

The adhesive film of the present invention can exhibit contrary characteristics depending on a temperature condition such as having thermal tolerance and adhesiveness at a predetermined temperature and having easy peelability at a temperature different from the predetermined temperature.

Therefore, the adhesive film of the present invention, when being used in a method for manufacturing a semiconductor and the like that requires such characteristics, has thermal tolerance and adhesiveness at the temperature of a mounting step or of a resin molding step and has easy peelability in a step of removing a semiconductor chip from a supporting body after the resin molding. Thus, a semiconductor device can be manufactured in a simple method. As such, the method for manufacturing a semiconductor device using the adhesive film of the present invention has excellent productivity and can increase a yield.

BRIEF DESCRIPTION OF THE DRAWINGS

The above and other objects, features, and advantages will be more apparent from the following description of a preferred embodiment and the accompanying drawings.

DESCRIPTION OF EMBODIMENTS

Hereinafter, an embodiment of the present invention will be appropriately described by using the drawings. In all of the drawings, corresponding elements will be designated by the same reference sign, and descriptions thereof will not be repeated appropriately.

Figure 1:
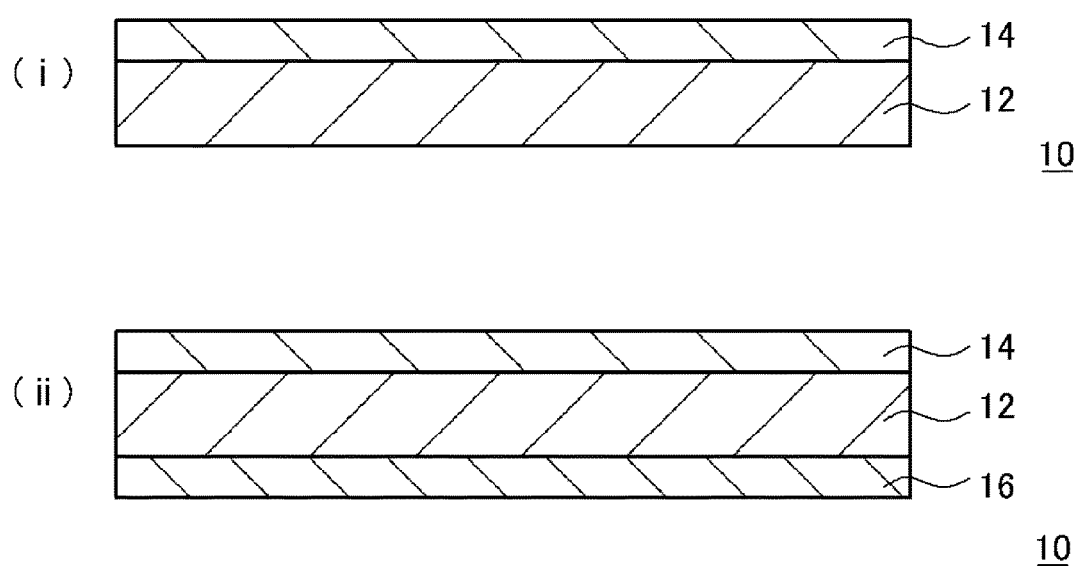
FIG. 1 is a schematic sectional view illustrating an adhesive film of an embodiment.

An adhesive film 10 of the present embodiment includes a base material layer 12 and a self-peeling adhesive layer 14 that are laminated as illustrated in FIG. 1.

[Base Material Layer 12]

The base material layer 12 has a thermal contraction percentage in a direction of flow (thermal contraction percentage in an MD direction) and a thermal contraction percentage in an orthogonal direction with respect to the direction of flow (thermal contraction percentage in a TD direction) that satisfy the following conditions.

(1) After Heating at 150° C. for 30 Minutes 0.4≤|thermal contraction percentage in MD direction/thermal contraction percentage in TD direction|≤2.5 average of thermal contraction percentage in MD direction and thermal contraction percentage in TD direction 2%

(2) After Heating at 200° C. for 10 Minutes 0.4≤|thermal contraction percentage in MD direction/thermal contraction percentage in TD direction|≤2.5 average of thermal contraction percentage in MD direction and thermal contraction percentage in TD direction≥3%

Thermal contractility of a resin film that is used as the base material layer 12 in a step of encapsulating a semiconductor chip can be determined by heating the resin film at 150° C. for 30 minutes.

In a method for manufacturing a semiconductor device, the temperature of the encapsulating step is approximately 150° C. at most, and the thermal contraction of the resin film ends in a certain amount of heating time. The thermal contraction of the resin film, which is the base material layer, at 150° C. mostly ends after heating for 30 minutes. Therefore, if the thermal contraction percentage of the resin film, which is the base material layer 12, heated at 150° C. for 30 minutes satisfies the above condition (1), it can be determined that the peeling off of the adhesive film 10 from the supporting substrate is suppressed during the step of encapsulating the semiconductor chip.

Thermal contractility of the resin film that is used as the base material layer 12 in a step of peeling the encapsulated semiconductor chip (package) off from the supporting substrate can be determined by heating the resin film at 200° C. for 10 minutes.

Since the temperature of the encapsulating step is approximately 150° C. at most in the method for manufacturing a semiconductor device, the resin film of the present embodiment is heated at a temperature over 150° C. in the step of peeling off from the supporting substrate. Unlike the encapsulating step, the peeling off from the supporting substrate is desirably performed in a short amount of time. Therefore, if the thermal contraction percentage of the resin film, which is the base material layer 12, heated at 200° C., which is higher than the temperature of the encapsulating step, for 10 minutes satisfies the above condition (2), it can be determined that the adhesive film 10 is easily peeled off from the supporting substrate in peeling the package off from the supporting substrate.

The term "|contraction percentage in MD direction/contraction percentage in TD direction|" represents the absolute value of the ratio of the contraction percentage in the MD direction to the contraction percentage in the TD direction. If the value is greater than or equal to 0.4 and less than or equal to 2.5 or preferably greater than or equal to 0.6 and less than or equal to 2.5, the contraction percentage in the MD direction and the contraction percentage in the TD direction are isotropic without having directional dependency.

From the isotropy thereof, stress caused by anisotropy of the contraction percentage of the base material layer 12 is unlikely to occur, and thus, with less bending occurring in the encapsulating step, a leakage and bending of an encapsulating resin can be suppressed. In addition, with less bending occurring in the peeling step, damage to the package can be prevented, and the peeling is facilitated.

The term "average of thermal contraction percentage in MD direction and thermal contraction percentage in TD direction" after heating at 150° C. for 30 minutes is less than or equal to 2% or preferably less than or equal to 1.8%. Accordingly, the self-peeling adhesive layer 14 being peeled by the thermal contraction of the base material layer 12 can be suppressed in the step of encapsulating the semiconductor chip.

Meanwhile, the term "average of thermal contraction percentage in MD direction and thermal contraction percentage in TD direction" after heating at 200° C. for 10 minutes is greater than or equal to 3% or preferably greater than or equal to 3.5%. Accordingly, peeling of the self-peeling adhesive layer 14 can be promoted by the thermal contraction of the base material layer 12 in the step of peeling the package off from the supporting substrate.

In addition, the effect of facilitating the peeling is also achieved if the thermal contraction of the base material layer 12 decreases the strength of adhesion in the end portions of the base material layer 12. Furthermore, the peeling can be promoted by stress that occurs from the thermal contraction of the base material layer 12.

Therefore, the base material layer 12 satisfying the above conditions, in the method for manufacturing a semiconductor device described later, can exhibit thermal tolerance and adhesiveness without contracting at the temperature of a mounting step or of a resin molding step and can be contracted in the step of peeling the semiconductor chip off from the supporting body after the resin molding, thereby being capable of exhibiting easy peelability. The adhesive film 10 of the present embodiment can be successfully used as an adhesive film for manufacturing semiconductor device.

A storage modulus E' of the base material layer 12 at 180° C. can be greater than or equal to 1.0E+6 and less than or equal to 2.0E+8 or preferably greater than or equal to 5.0E+6 and less than or equal to 2.0E+8 in the present embodiment.

Within this range, the base material layer 12 has appropriate rigidity as a base material, and furthermore, the self-peeling adhesive layer 14 can be peeled off from the end portions of the base material layer 12. Therefore, an excellent balance is achieved therebetween.

The base material layer 12 can be configured of one layer or a multilayer structure of two layers or more in the present embodiment. The base material layer 12, as a whole, is configured to have a thermal contraction percentage that satisfies the above conditions.

A resin having high thermal tolerance that satisfies the above conditions can be used as a resin constituting the base material layer 12, and such a resin can be exemplified by, for example, a polyester resin, a polyimide resin, and a polyamide resin. Among these, a polyester resin or a polyamide resin is preferably used. The polyester resin that is described in the paragraph 0026 to the paragraph 0036 of Japanese Unexamined Patent Publication No. 2009-172864 can be used as the polyester resin herein, and the known polyamide resin that is described in Pamphlet of International Publication No. WO2012/117884 can be used as the polyamide resin herein.

A polyester resin is particularly preferred in the present embodiment and can be exemplified by, for example, a polyethylene terephthalate resin, a polyethylene naphthalate resin, and an amorphous polyethylene terephthalate resin.

The base material layer 12 can be used in the form of a resin film.

The resin film constituting the base material layer 12 can be obtained as an amorphous or low-crystallinity film by inhibiting crystallization of a resin having high thermal tolerance and forming the resin into a film. For example, a method of melting and rapidly cooling the resin, a method of performing heat processing of the resin at a temperature over the melting point thereof, and a method of stretching the resin to prevent oriented crystallization thereof can be used. The crystallization can be inhibited with comonomers by appropriately selecting a copolymer ingredient other than main ingredients.

The base material layer 12 having a thickness less than or equal to 500 μm (for example, 1 μm to 500 μm) is generally selected, and the thickness is preferably approximately 1 μm to 300 μm or more preferably approximately 5 μm to 250 μm. The resin film used in the base material layer may be a single layer or a multilayer.

[Self-Peeling Adhesive Layer 14]

An adhesive that is included in the self-peeling adhesive layer 14 is an adhesive that has an adhesive strength decreased or lost when being heated in the present embodiment. A material that is not peeled off at a temperature of 150° C. or less and is peeled off at a temperature over 150° C. can be selected for the self-peeling adhesive layer 14. For example, the adhesive preferably has a certain level of adhesive strength with which a semiconductor element is not peeled off from a supporting plate during a step of manufacturing a semiconductor device.

As the adhesive included in the self-peeling adhesive layer 14, an adhesive that includes an ingredient producing gas, an adhesive that includes a thermally expandable microsphere, an adhesive that has an adhesive strength that is decreased when adhesive ingredients react in a cross-linked manner by heat, or the like is preferably used.

As the ingredient producing gas, for example, an azo compound, an azide compound, or a Meldrum's acid derivative is preferably used. In addition, an ingredient that includes an inorganic foaming agent such as an ammonium carbonate, an ammonium bicarbonate, a sodium bicarbonate, or an ammonium nitrite or an ingredient that includes an organic foaming agent such as a chlorofluoroalkane, a hydrazine compound, a semicarbazide compound, a triazole compound, an N-nitroso compound, or the like is also used. The ingredient producing gas may be added to the adhesive (resin) or may be directly bonded to the resin.

As the thermally expandable microsphere, a substance forming a shell that includes a substance exhibiting thermal expandability when being gasified can be used. As the adhesive that has an adhesive strength decreased when reacting in a cross-linked manner by energy, for example, an adhesive that contains a polymerizable oligomer and has an adhesive strength that is decreased when the polymerizable oligomer reacts in a cross-linked manner can be used. These ingredients can be added to the adhesive (resin).

The temperature at which gas is produced, the temperature at which the thermally expandable microsphere thermally expands, and the temperature for the cross-linked reaction may be designed to be a temperature over 150° C.

The resin constituting the adhesive can be exemplified by an acrylic resin, a urethane resin, a silicone resin, and a polyolefin resin.

The adhesive film 10 of the present embodiment, as illustrated in FIG. 1(ii), may further include an adhesive layer 16 that is laminated on the base material layer 12 on a side opposite to the side on which the self-peeling adhesive layer 14 is laminated.

(Adhesive Layer 16)

An adhesive known in the art can be used as an adhesive constituting the adhesive layer 16. An adhesive that leaves less adhesive residue is preferably used from the viewpoint of reusing the supporting substrate when the adhesive film of the present embodiment is used in manufacturing a wafer support system, a ceramic capacitor, or a semiconductor device. Particularly, if a pressure-sensitive adhesive is used, workability is improved in the adhesion step and in the peeling step, and furthermore, less adhesive residue can lead to increased semiconductor device yield.

The pressure-sensitive adhesive can be exemplified by a rubber pressure-sensitive adhesive in which a rubber polymer such as natural rubber, polyisobutylene rubber, styrene-butadiene rubber, styrene-isoprene-styrene block copolymer rubber, reclaimed rubber, butyl rubber, polyisobutylene rubber, or an NBR is used as a base polymer; a silicone pressure-sensitive adhesive; a urethane pressure-sensitive adhesive; and an acrylic pressure-sensitive adhesive. A base agent may comprise one type or two or more kinds of ingredients. Particularly, an acrylic pressure-sensitive adhesive is preferred.

A method for manufacturing an acrylic pressure-sensitive adhesive can be appropriately selected from known manufacturing methods of solution polymerization, mass polymerization, emulsion polymerization, and various types of radical polymerization and the like. The adhesive resin obtained may be any of a random copolymer, a block copolymer, and a graft copolymer.

The adhesive film of the present embodiment can be used in manufacturing a semiconductor device, temporarily fixing a member, and the like and, particularly, can be successfully used in e-WLB.

Hereinafter, a method for manufacturing a semiconductor device using the adhesive film 10 of FIG. 1(i) will be described.

<Method for Manufacturing Semiconductor Device>

The method for manufacturing a semiconductor device according to the present embodiment includes the following steps.

Figure 2:
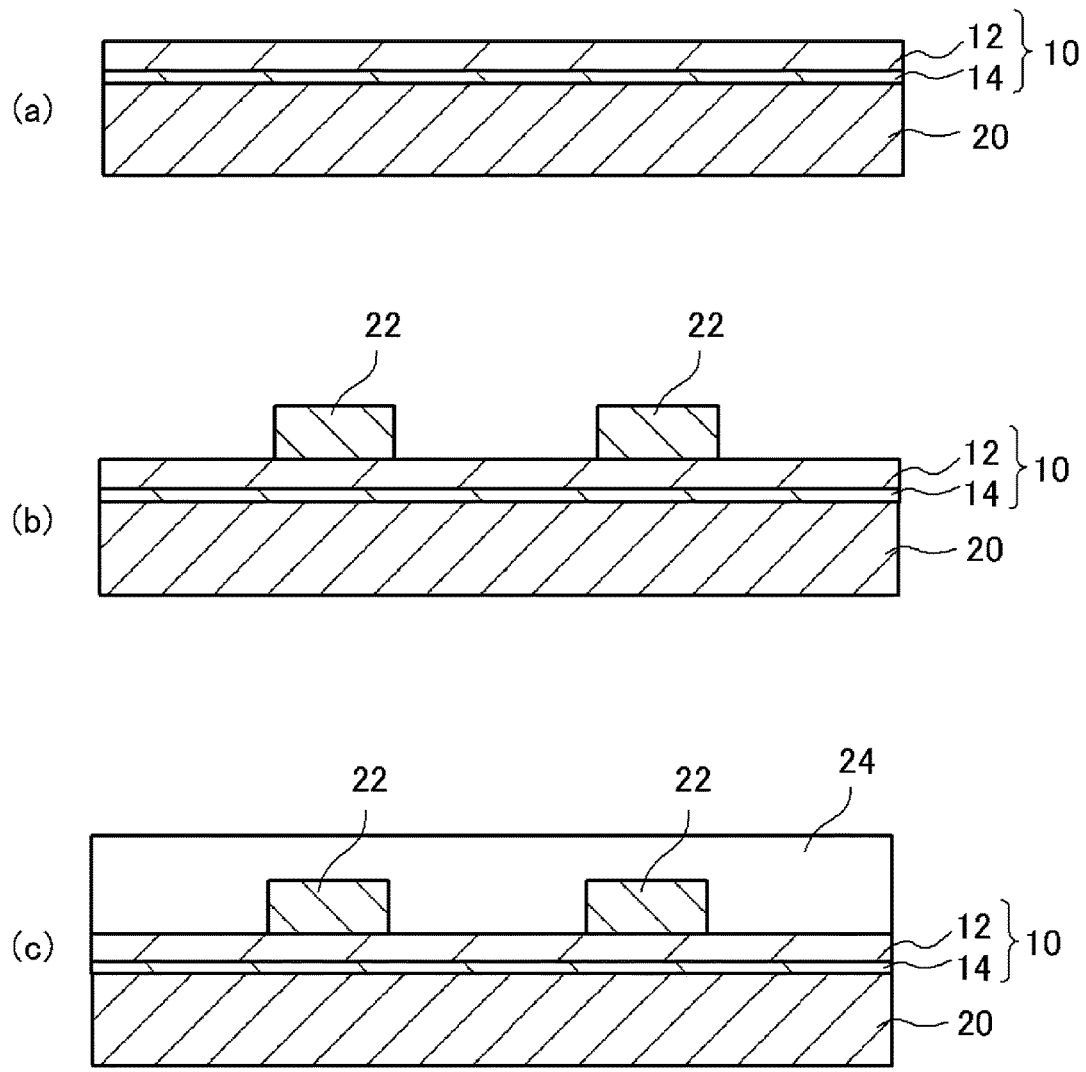
FIG. 2 is a schematic step diagram illustrating a method for manufacturing a semiconductor device of the embodiment.

Step (a): adhering the adhesive film 10 onto the supporting substrate 20 such that the self-peeling adhesive layer 14 is on the supporting substrate 20 side of the adhesive film 10 (FIG. 2(a)).

Step (b): mounting a semiconductor chip 22 on the base material layer 12 of the adhesive film 10 (FIG. 2(b)).

Step (c): forming an encapsulating layer 24 to cover the semiconductor chip 22 and the adhesive film 10 and cure the encapsulating layer 24 at a temperature of 150° C. or less to form a semiconductor chip mold with an attached supporting base material (FIG. 2(c)).

Step (d): heating the semiconductor chip mold with an attached supporting base material at a temperature over 150° C. to decrease the adhesive strength of the self-peeling adhesive layer 14 and remove the supporting substrate 20 from the semiconductor chip mold with an attached supporting base material (FIG. 3(d)).

Step (e): removing the adhesive film 10 to obtain the semiconductor chip mold (FIG. 3(e)).

The following steps may be further included in the present embodiment.

Step (f): forming an interconnect layer 26 on an exposed side of the semiconductor chip mold, the interconnect layer 26 including a pad (not illustrated) that is provided on the outermost side thereof and an interconnect (not illustrated) that electrically connects the exposed semiconductor chip 22 to the pad (FIG. 3(f)).

Step (g): providing a bump 28 on the pad (FIG. 3(g)).

Hereinafter, each step will be described in order.

(Step (a))

First, the adhesive film 10 is adhered onto the supporting substrate 20 such that the self-peeling adhesive layer 14 is on the supporting substrate 20 side of the adhesive film 10 (FIG. 2(a)). A protective film may be attached onto the self-peeling adhesive layer 14, in case that the protective film is used, the adhesive film 10 can adhered after peeling the protective film off, such that the exposed side of the self-peeling adhesive layer 14 is adhered to a surface of the supporting substrate 20.

The supporting substrate 20 can be exemplified by a quartz substrate or a glass substrate.

(Step (b))

Next, the semiconductor chip 22 is mounted on the base material layer 12 of the adhesive film 10 that is adhered onto the supporting substrate 20 (FIG. 2(b)).

The semiconductor chip can be exemplified by an IC, LSI, a light-emitting diode, or a light-receiving element. The surface of the base material layer 12 may be subjected to surface treatment in order to improve adhesiveness with the semiconductor chip 22.

While the semiconductor chip 22 is described as being mounted on the base material layer 12 in the present embodiment, the semiconductor chip 22 can be mounted on the adhesive layer 16 that is laminated on the base material layer 12.

(Step (c))

The encapsulating layer 24 is formed to cover the semiconductor chip 22 and the adhesive film 10, and the encapsulating layer 24 is cured at a temperature of 150° C. or less to form the semiconductor chip mold with an attached supporting base material (FIG. 2(c)).

An encapsulating material used for forming of the encapsulating layer 24 is not particularly limited. A generally used encapsulating material, such as a thermosetting molding material, that contains an epoxy resin as a main ingredient and into which silica filler or the like is added can be used.

A method for the encapsulating includes low-pressure transfer. In addition, the encapsulating can be performed by injection molding, compression molding, casting, or the like. After the encapsulating with the encapsulating layer 24, the encapsulating layer 24 is cured by being heated at a temperature of 150° C. or less to obtain the semiconductor chip mold with an attached supporting base material in which the semiconductor chip 22 is encapsulated.

The base material layer 12 of the adhesive film 10 has thermal contractility such as described above after heating at 150° C. for 30 minutes and can suppress peeling of the self-peeling adhesive layer 14 at the temperature of curing of 150° C. or less.

(Step (d))

After the semiconductor chip 22 is encapsulated, the semiconductor chip mold with an attached supporting base material is heated at a temperature over 150° C. to decrease the adhesive strength of the self-peeling adhesive layer 14, and the supporting substrate 20 is removed from the semiconductor chip mold with an attached supporting base material (FIG. 3(d)).

The base material layer 12 of the adhesive film 10 has an average of the thermal contraction percentage in the MD direction and the thermal contraction percentage in the TD direction greater than or equal to 3% after heating at 200° C. for 10 minutes and significantly produces thermal contraction at the temperature of heating. Thus, stress from the thermal contraction of the base material layer 12 increases noticeably, and the adhesiveness of the self-peeling adhesive layer 14 can be decreased.

(Step (e))

Figure 3:
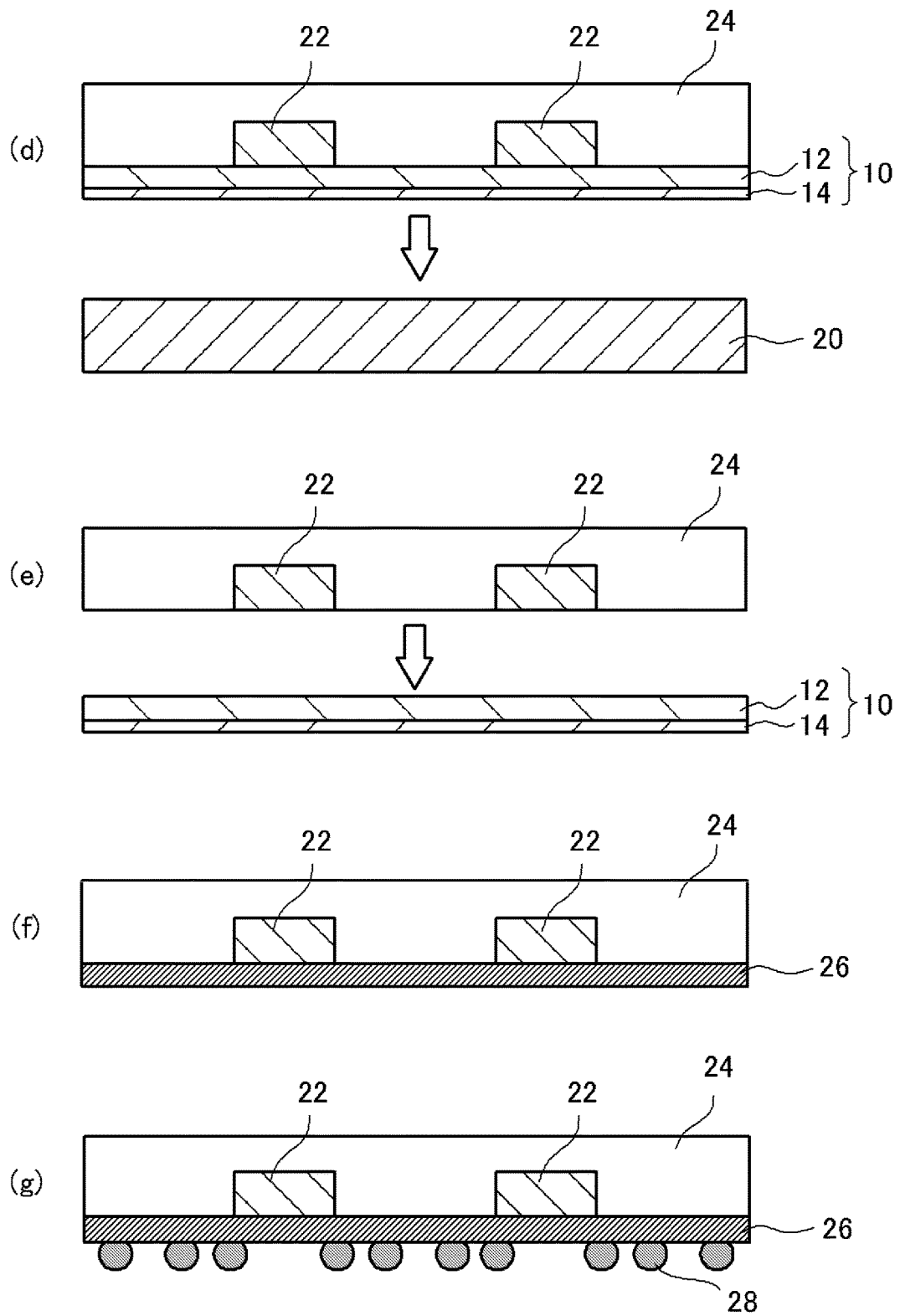
FIG. 3 is a schematic step diagram illustrating the method for manufacturing the semiconductor device of the embodiment.

After the supporting substrate 20 is removed, furthermore, the adhesive film 10 is removed to obtain the semiconductor chip mold (FIG. 3(*e*)).

If the semiconductor chip mold is removed from the adhesive film 10, a manner of removing may be appropriately selected depending on the quality of the material of the base material layer 12. The semiconductor chip mold may be mechanically removed or may be removed by decreasing the adhesive strength of the surface of the base material layer 12.

If another adhesive layer 16, not illustrated, is included on the base material layer 12, a generally used adhesive can be used as the adhesive layer 16 according to the material of the semiconductor chip 22 or conditions of a manufacturing step. In addition, a self-peeling adhesive, such as the adhesive used in the self-peeling adhesive layer 14, that has an adhesive strength that is decreased by thermal energy may be used. If the self-peeling adhesive is used, the adhesive strength thereof can be decreased by thermal energy of intensity greater than or equal to that used for the adhesive that is used on the side on which the supporting substrate 20 is adhered.

A method for removing the adhesive film 10 from the semiconductor chip mold can be appropriately selected according to the adhesive that is used on the side of the adhesive film 10 where the semiconductor chip mold is adhered. The semiconductor chip mold may be mechanically removed or may be removed by decreasing the adhesive strength of the adhesive.

(Steps (f) and (g))

Next, the interconnect layer 26 is formed on the exposed side of the semiconductor chip mold obtained (FIG. 3(*f*)).

The interconnect layer 26 includes a pad (not illustrated) that is an external connection terminal formed on the outermost side of the interconnect layer 26 and includes an interconnect (not illustrated) that electrically connects the exposed semiconductor chip 22 to the pad. The interconnect layer 26 can be formed in a method known in the art and may have a multilayer structure.

Then, the bump 28 is provided on the pad of the interconnect layer 26, and a semiconductor device can be obtained. The bump 28 can be exemplified by a solder bump or a gold bump. A solder bump can be provided by, for example, arranging a solder ball, shaped in advance, on the pad which is the external connection terminal of the interconnect film and heating to melt (reflow) the solder ball. A gold bump can be provided in a method such as ball bonding, plating, or Au ball transfer.

Then, the semiconductor device is divided into individual pieces by dicing.

As described heretofore, the adhesive film 10 of the present embodiment, when being used in the method for manufacturing a semiconductor device, has thermal tolerance and adhesiveness at the temperature under which the mounting step or the resin molding step are conducted, and exhibits easy peelability at the step of removing the semiconductor chip from the supporting body after the resin molding. Thus, a semiconductor device can be manufactured in a simple method. Therefore, the method for manufacturing a semiconductor device using the adhesive film 10 of the present embodiment has excellent productivity and can have increased product yield.

The embodiment of the present invention described heretofore is for illustration of the present invention, and various configurations other than described above can be employed.

While the adhesive film 10 of the present embodiment is described in a form in which the self-peeling adhesive layer 14 is laminated on the surface of the base material layer 12, for example, a roughness absorbing layer, a shock absorbing layer, or an easy adhesion layer may be provided between the base material layer 12 and the self-peeling adhesive layer 14 to the extent not impairing the effect of the present invention. Here, the roughness has a height of approximately 5 μm to 300 μm.

While the adhesive film 10 of the present embodiment is described in a form in which the adhesive layer 16 is laminated on the surface of the base material layer 12, for example, a roughness absorbing layer, a shock absorbing layer, or an easy adhesion layer may be formed between the base material layer 12 and the adhesive layer 16 to the extent not impairing the effect of the present invention.

EXAMPLES

Hereinafter, the present invention will be described more specifically by an example and the like. It is to be noted that the scope of the present invention is not limited to these example and the like.

(Method for Evaluating Self-Peelability)

The self-peelability of the supporting substrate 20 was evaluated by using a laminate of a 100 mm square plate (SUS304) as the supporting substrate 20, a double-sided adhesive film that is obtained as the adhesive film 10 in a preparation example, and a circular plate (made of Ni-plated steel) having a diameter of 80 mm as the semiconductor chip 22.

The self-peeling adhesive layer 14 side of the adhesive film 10 was adhered to the 100 mm square plate (SUS304) (supporting plate 20). Then, the circular plate (made of Ni-plated steel) having a diameter of 80 mm as the semiconductor chip 22 was attached to the other side of the adhesive layers of the double-sided adhesive tape (adhesive film 10) to form a laminate. A measuring jig was installed to this laminate for evaluating the peelability of the supporting substrate 20. In this example, a reinforcing double-sided tape (product name: P-223, manufactured by Nitto Denko Corporation) for measuring was used in order to prevent peeling at a boundary between the semiconductor chip 22 and the adhesive film 10 during a self-peelability test at a boundary between the supporting substrate 20 and the adhesive film 10.

A measuring sample was placed on a heat block and was heated for a predetermined amount of time. Then, the self-peelability thereof was evaluated with a tensile tester.

Figure 4:
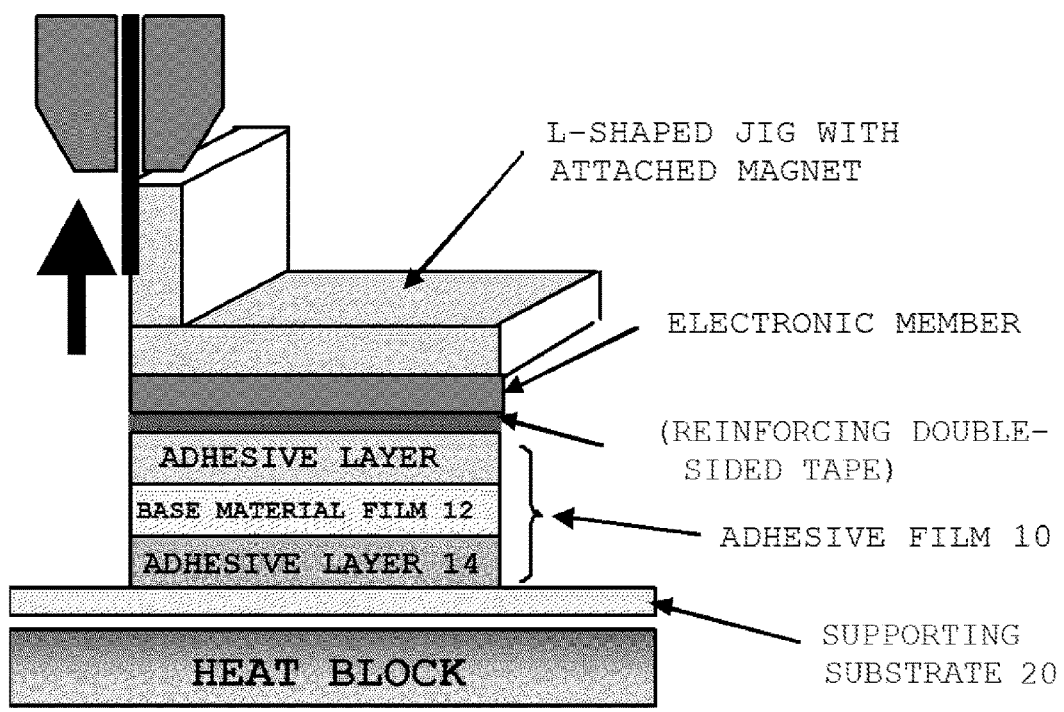
FIG. 4 is a diagram illustrating a method for evaluating peelability in an example.

As illustrated in FIG. 4, the laminate was fixed by using a jig, and the processes described in this example were conducted. Then, the self-peelability thereof was evaluated according to the following standard by pulling a hook upward with the tensile tester. The tensile tester uses an L-shaped jig with an attached magnet and has a structure in which the magnet is separated at a tensile strength of 50 N or greater. If the magnet is separated, the supporting substrate 20 is evaluated as not peeled.

A: peeled (after heating for shorter than or equal to 60 seconds),

B: peeled (after heating for shorter than or equal to 180 seconds),

C: not peeled (Method for Measuring Storage Modulus)

A part of a semiconductor wafer surface protecting adhesive film corresponding to a base material film layer was cut to prepare an oblong sample (30 mm in the MD direction and 10 mm in the ID direction). The storage modulus (in the machine direction) thereof is measured from 0° C. to 300° C. by using a dynamic viscoelasticity measuring device (model: RSA-III, manufactured by Rheometrics). The measurement frequency was set to 1 Hz, and the strain was set to 0.01% to 0.3%.

(Method for Measuring Thermal Contraction Percentage of Base Material Film)

A base material film was cut into squares (15 cm in the MD direction and 15 cm in the TD direction), and the base material film was punched holes (10 cm in the MD direction and 10 cm in the TD direction) to prepare a sample. The interval between the holes provided in the base material film was measured by using a two-dimensional measurer (model: CRYSTAL*μV606, manufactured by Mitutoyo Corporation). The sample after measuring was statically placed in an oven at a predetermined temperature. The sample was taken from the oven after a predetermined amount of time, and the interval between the holes was measured. The thermal contraction percentage (%) before and after heating was calculated in the MD direction and in the TD direction on the basis of the following expression. The measuring was conducted for 10 pieces of samples, and the result was shown in terms of the thermal contraction percentage of the base material film. In the expression, the symbol L0 indicates the interval between the holes before heating, and the symbol L indicates the interval between the holes after heating.

$$\text{thermal contraction percentage (\%)} = 100 \times (L-L_0)/L_0$$

Preparation Example 1

To a 500 mL four-neck flask, 100 g of methylmalonic acid (manufactured by Tokyo Chemical Industry Co., Ltd) and 100 g of acetic anhydride were charged. Subsequently, 0.5 g of 98% sulfuric acid was added to the flask, after that, 75 g of methyl ethyl ketone was added dropwise to the flask over one hour using a dropping funnel. After stirring at room temperature for 24 hours, 200 g of ethyl acetate and 300 g of distilled water were added, and resulting organic layer was isolated with a separating funnel. The obtained organic layer was distilled with an evaporator to obtain 75 g of 2-ethyl-2,5-dimethyl-1,3-dioxane-4,6-dione. By evaluating with $^1$HNMR (at 300 MHz), following peak was obtained. δ=1.04-1.12 (m, 3H), 1.57-1.61 (m, 3H), 1.71 (s, 1.12H), 1.77 (s, 1.92H), 1.95-2.16 (m, 2H), 3.53-5.65 (m, 1H).

Preparation Example 2

To a 500 mL four-neck flask, 92 g of the 2-ethyl-2,5-dimethyl-1,3-dioxane-4,6-dione synthesized in Preparation Example 1 and 100 g of dimethylformamide were charged. Subsequently, 95 g of potassium carbonate was added to the flask, after that, 97 g of 4-chloromethylstyrene was added dropwise to the flask over one hour using a dropping funnel. After stirring at 40° C. for 24 hours, 400 g of ethyl acetate was added, and resulting solid was filtered through a Nutsche. The filtrate was rinsed twice with 300 mL of distilled water using a separating funnel, and then, the solvent is distilled with an evaporator to obtain 132 g of 5-(p-styryl methyl)-2-ethyl-2,5-dimethyl-1,3-dioxane-4,6-dione. By evaluating with $^1$HNMR (at 300 MHz), following peak was obtained. δ=0.43 (t, 8.1 Hz, 1.6H), 0.83 (s, 1.3H), 0.94 (t, 8.1 Hz, 1.4H), 1.27 (q, 8.1 Hz, 1.2H), 1.57 (s, 1.7H), 1.75 (s, 3H), 1.80 (q, 8.1 Hz, 0.8H), 3.31 (s, 2H), 5.22 (d, 12.0 Hz, 1H), 5.70 (d, 19.5 Hz, 1H), 6.65 (dd, 12.0, 19.5 Hz, 1H), 7.16 (d, 9.0 Hz, 2H), 7.31 (d, 9.0 Hz, 2H).

Preparation Example 3

To a polymerization reactor, 150 parts by weight of deionized water, 0.625 parts by weight of 4,4'-azobis-4-cyanovaleric acid (product name: ACVA, manufactured by Otsuka Chemical Co., Ltd) as a polymerization initiator, 62.25 parts by weight of 2-ethylhexyl acrylate, 18 parts by weight of n-butyl acrylate, 12 parts by weight of methyl methacrylate, 3 parts by weight of 2-hydroxyethyl methacrylate, 2 parts by weight of methacrylate, 1 part by weight of acrylamide, 1 part by weight of polytetramethylene glycol diacrylate (product name: ADT-250, manufactured by NOF Corporation), and 0.75 parts by weight of Aqualon HS-10 (product name, manufactured by DKS Co., Ltd) in which a polymerizable 1-propenyl group is introduced into a benzene ring of an ammonium salt of a sulfuric ester of polyoxyethylene nonylphenyl ether (average number of moles of introduced ethylene oxide: approximately 20) were charged. The resulting mixture was stirred at 70° C. to 72° C. for eight hours, and emulsion polymerization was allowed to proceed. Resulting acrylic resin emulsion was neutralized (pH=7.0) with 9 wt % ammonia water to obtain an acrylic adhesive S with a solids content of 42.5 wt % (acrylic adhesive S was a pressure-sensitive adhesive).

Preparation Example 4

To a 500 mL four-neck flask, 15 g of the 5-(p-styryl methyl)-2-ethyl-2,5-dimethyl-1,3-dioxane-4,6-dione synthesized in Preparation Example 2, 20 g of butyl acrylate, 63 g of 2-ethylhexyl acrylate, 2 g of methacrylate, and 100 g of ethyl acetate were added and mixed at room temperature. Subsequently, 0.2 g of 2,2'-azobis valeronitrile was added, and the mixture was heated up to 75° C. and stirred for 10 hours to obtain an acrylic adhesive A with a molecular weight of 300,000 (acrylic adhesive A is a self-peeling adhesive). By evaluating with differential scanning calorimetry (DSC-60 manufactured by Shimadzu Corporation), the resultant had a glass transition temperature of 14° C.

Preparation Example 5

To 100 parts by weight of the acrylic adhesive S which was prepared in Preparation Example 3, 9 wt % ammonia water was added to adjust the pH to 9.5. Subsequently, 0.8 parts by weight of an epoxy cross-linking agent (product name: Chemitight Pz-33, manufactured by Nippon Shokubai Co., Ltd) was added to obtain an adhesive coating liquid.

The adhesive coating liquid thus obtained was applied onto a PET film (mold release film) whose surface was treated with a releasing agent, by using an applicator such that a dried coating of the adhesive coating liquid had a thickness of 10 μm. Subsequently, the applied coating liquid was heated and dried at 120° C. for five minutes to obtain a PET film with an attached pressure-sensitive adhesive layer. Thus obtained PET film was attached to both sides of a contractible PET film (Teflex FT-50 of a thickness of 50 μm, manufactured by Teijin DuPont Films) that was used as the base material layer 12, such that the pressure-sensitive adhesive layer was on the contractible PET film side.

The resulting film was cured at 60° C. for three days to obtain a double-sided adhesive film 1 (mold release film/pressure-sensitive adhesive layer/base material film/pressure-sensitive adhesive layer/mold release film).

Preparation Example 6

To 100 parts by weight of the acrylic adhesive A which was prepared in Preparation Example 4, 2 parts by weight of an epoxy compound (TETRAD-C, manufactured by Mitsubishi Gas Chemical Company, Inc.), and 50 parts by weight of ethyl acetate were added to obtain an adhesive coating liquid.

The adhesive coating liquid thus obtained was applied onto a PET film (mold release film) whose surface was treated with a releasing agent, by using an applicator such that a dried coating of the adhesive coating liquid had a thickness of 10 μm. Subsequently, the applied coating liquid was heated and dried at 120° C. for five minutes to obtain a PET film with an attached pressure-sensitive adhesive layer. Thus obtained PET film was attached to both sides of a contractible PET film (Teflex FT-50 of a thickness of 50 μm, manufactured by Teijin DuPont Films) that was used as the base material layer 12, such that the self-peeling adhesive layer is on the contractible PET film side.

Additionally, to 100 parts by weight of the acrylic adhesive S which was prepared in Preparation Example 3, 9 wt % ammonia water was added to adjust the pH to 9.5. Subsequently, 0.8 parts by weight of an epoxy cross-linking agent (product name: Chemitight Pz-33, manufactured by Nippon Shokubai Co., Ltd) was added to obtain an adhesive coating liquid.

The adhesive coating liquid thus obtained was applied onto a PET film (mold release film) whose surface was treated with a releasing agent, by using an applicator such that a dried coating of the adhesive coating liquid had a thickness of 10 μm. Subsequently, the applied coating liquid was heated and dried at 120° C. for five minutes to obtain a PET film with an attached pressure-sensitive adhesive layer. Thus obtained PET film was attached to the contractible PET film on aside opposite to the side on which the self-peeling adhesive layer is provided, such that the pressure-sensitive adhesive layer is on the contractible PET film side.

The resulting film was cured at 60° C. for three days to obtain a double-sided adhesive film 2 (mold release film/self-peeling adhesive layer/base material film/pressure-sensitive adhesive layer/mold release film).

Preparation Example 7

A double-sided adhesive film 3 was obtained (mold release film/self-peeling adhesive layer/base material film/pressure-sensitive adhesive layer/mold release film) in the same manner as Preparation Example 6 except that a PET film (Lumirror of a thickness of 50 μm, manufactured by Toray Industries, Inc.) was used as a base material film.

Preparation Example 8

A double-sided adhesive film 4 was obtained (mold release film/self-peeling adhesive layer/base material film/pressure-sensitive adhesive layer/mold release film) in the same manner as Preparation Example 6 except that a PET film (AD-50 of a thickness of 50 μm, manufactured by Teijin DuPont Films) was used as a base material film.

Preparation Example 9

A double-sided adhesive film 5 was obtained (mold release film/self-peeling adhesive layer/base material film/pressure-sensitive adhesive layer/mold release film) in the same manner as Preparation Example 6 except that a PET film (Teijin Tetoron film G2-50 with a thickness of 50 μm, manufactured by Teijin DuPont Films) was used as a base material film.

Preparation Example 10

A double-sided adhesive film 6 was obtained (mold release film/self-peeling adhesive layer/base material film/pressure-sensitive adhesive layer/mold release film) in the same manner as Preparation Example 6 except that a PET film (Emblet S-50 of a thickness of 50 μm, manufactured by Unitika Ltd) was used as a base material film.

Example 1

The mold release film was peeled off from the double-sided adhesive film 2 that was cut into a circular shape of a diameter of 84 mm, and the self-peeling adhesive layer side of the double-sided adhesive film 2 was attached to a 100 mm square plate (SUS304). Then, a circular plate (made of Ni-plated steel) having a diameter of 80 mm was attached to the pressure-sensitive adhesive layer of the double-sided adhesive film 2 to obtain a laminate.

The measuring jig as illustrated in FIG. 4 was installed to this laminate to obtain a measuring sample.

The measuring sample was heated at 210° C. for 60 seconds on a heat block as illustrated in FIG. 4, and was evaluated for the peelability using the tensile tester after confirmed that the part of the self-peeling adhesive layer adhered to the 100 mm square plate was peeled. The evaluation result is illustrated in Table 1.

Example 2

The mold release film was peeled off from the double-sided adhesive film 2 that is cut into a circular shape of a diameter of 86 mm, and the self-peeling adhesive layer side of the double-sided adhesive film 2 was attached to a 100 mm square plate (SUS304). Then, a circular plate (made of Ni-plated steel) having a diameter of 80 mm was attached to the pressure-sensitive adhesive layer of the double-sided adhesive film 2 to obtain a laminate.

The measuring jig as illustrated in FIG. 4 was installed to this laminate to obtain a measuring sample.

The measuring sample was heated at 210° C. for 60 seconds on a heat block as illustrated in FIG. 4, and was evaluated for the peelability using the tensile tester after confirmed that the part of the self-peeling adhesive layer adhered to the 100 mm square plate was peeled. The evaluation result is illustrated in Table 1.

Example 3

A measuring sample was obtained in the same manner as Example 1 except that the double-sided adhesive film 3 was used. The measuring sample was heated at 210° C. for 60 seconds on a heat block as illustrated in FIG. 4, but the part of the self-peeling adhesive layer adhered to the 100 mm square plate was not peeled. The measuring sample was additionally heated for 120 seconds (heated for total 180 seconds), and it was confirmed that the part of the self-peeling adhesive layer adhered to the 100 mm square plate was peeled. Then, peelability was evaluated using the tensile tester. The evaluation result is illustrated in Table 1.

Comparative Example 1

The mold release film was peeled off from the double-sided adhesive film 1 that is cut into a circular shape of a diameter of 84 mm, and one pressure-sensitive adhesive layer side of the double-sided adhesive film 1 was attached to a 100 mm square plate (SUS304). Then, a circular plate (made of Ni-plated steel) having a diameter of 80 mm was attached to the other side of the double-sided adhesive film 1 to obtain a laminate.

The measuring jig as illustrated in FIG. 4 was installed to this laminate to obtain a measuring sample.

The measuring sample was heated at 210° C. for 60 seconds on a heat block as illustrated in FIG. 4, but the part of the pressure-sensitive adhesive layer adhered to the 100 mm square plate was not peeled. The measuring sample was further heated for 120 seconds (heated for total 180 seconds), but the part of the pressure-sensitive adhesive layer adhered to the 100 mm square plate was not peeled. Then, peelability was evaluated using the tensile tester. The evaluation result is illustrated in Table 1.

Comparative Examples 2 to 4

Evaluation was performed in the same manner as Comparative Example 1 except that the double-sided adhesive films 4 to 6 were used and that the self-peeling adhesive layer was attached to a 100 mm square plate (SUS304). The evaluation result is illustrated in Table 1.

(1) after heating at 150° C. for 30 minutes, $0.4 \leq |$thermal contraction percentage in MD direction/thermal contraction percentage in TD direction$| \leq 2.5$ and average of thermal contraction percentage in MD direction and thermal contraction percentage in TD direction$\leq 2\%$, and (2) after heating at 200° C. for 10 minutes, $0.4 \leq |$thermal contraction percentage in MD direction/thermal contraction percentage in TD direction$| \leq 2.5$ and average of thermal contraction percentage in MD direction and thermal contraction percentage in TD direction$\geq 3\%$.

2. The adhesive film according to claim 1,
wherein the self-peeling adhesive layer has an adhesive strength that is decreased by heat.

3. The adhesive film according to claim 1, further comprising an adhesive layer,
wherein the adhesive layer is laminated on the base material layer on a side opposite to the side on which the self-peeling adhesive layer is laminated.

4. The adhesive film according to claim 1,
wherein the base material layer has a storage modulus E' at 180° C. of greater than or equal to 1.0E+6 and less than or equal to 2.0E+8.

5. The adhesive film according to claim 1,
wherein the base material layer comprises a polyester resin, a polyimide resin, or a polyamide resin.

6. A method for manufacturing a semiconductor device comprising the steps of:
adhering the adhesive film according to claim 1 to a supporting substrate such that the self-peeling adhesive layer is on the supporting substrate side of the adhesive film;

TABLE 1

| | | Example 1 | Example 2 | Example 3 | Comparative Example 1 | Comparative Example 2 | Comparative Example 3 | Comparative Example 4 |
|---|---|---|---|---|---|---|---|---|
| Base material layer: maker | | Teijin | Teijin | Toray | Teijin | Teijin | Teijin | Unitika |
| Base material layer: model | | FT-50 | FT-50 | Lumirror | FT-50 | AD-50 | G2-50 | S-50 |
| Base material layer: thickness (μm) | | 50 | 50 | 50 | 50 | 50 | 50 | 50 |
| Thermal contraction percentage (%) at | MD | 2.4 | 2.4 | 1.6 | 2.4 | 12 | 1 | 1.2 |
| 150° C. × 30 min. | TD | 1.1 | 1.1 | 1 | 1.1 | −0.2 | 0.3 | 0.2 |
| Thermal contraction percentage (%) at | MD | 11.8 | 11.8 | 4.2 | 11.8 | 4.4 | 2.5 | 2.5 |
| 200° C. × 10 min. | TD | 11 | 11 | 3 | 11 | 1.1 | 0.2 | 1 |
| Average contraction percentage at 150° C. × 30 min. | | 1.75 | 1.75 | 1.30 | 1.75 | 5.90 | 0.65 | 0.70 |
| Absolute value of MD/TD at 150° C. × 30 min. | | 2.18 | 2.18 | 1.60 | 2.18 | 60.00 | 3.33 | 6.00 |
| Average contraction percentage at 200° C. × 10 min. | | 11.40 | 11.40 | 3.60 | 11.40 | 2.75 | 1.35 | 1.75 |
| Absolute value of MD/TD at 200° C. × 10 min. | | 1.07 | 1.07 | 1.40 | 1.07 | 4.00 | 12.50 | 2.50 |
| Storage modulus E' at 180° C. | | 4.0E+07 | 4.0E+07 | 1.2E+08 | 4.0E+07 | 3.6E+08 | 3.5E+08 | 3.7E+08 |
| Self-peelability | | A | A | B | C | C | C | C |

This application is based on and claims the benefit of priority from Japanese Patent Application No. 2013-178515, filed Aug. 29, 2013, the entire disclosure of which is incorporated herein.

The invention claimed is:

1. An adhesive film in which a base material layer and a self-peeling adhesive layer are laminated,
wherein the base material layer has a thermal contraction percentage in a direction of flow (thermal contraction percentage in an MD direction) and a thermal contraction percentage in an orthogonal direction with respect to the direction of flow (thermal contraction percentage in a TD direction) that satisfy the following conditions:

mounting a semiconductor chip on the base material layer of the adhesive film;
applying an encapsulating material to cover the semiconductor chip and the adhesive film and curing the encapsulating material at a temperature of 150° C. or less to form a semiconductor chip mold with an attached supporting base material;
heating at a temperature over 150° C. to decrease an adhesive strength of the self-peeling adhesive layer and removing the supporting substrate from the semiconductor chip mold with an attached supporting base material; and
removing the adhesive film to obtain a semiconductor chip mold.

7. A method for manufacturing a semiconductor device comprising the steps of:
- adhering the adhesive film according to claim 2 to a supporting substrate such that the self-peeling adhesive layer is on the supporting substrate side of the adhesive film;
- mounting a semiconductor chip on the base material layer of the adhesive film;
- applying an encapsulating material to cover the semiconductor chip and the adhesive film and curing the encapsulating material at a temperature of 150° C. or less to form a semiconductor chip mold with an attached supporting base material;
- heating at a temperature over 150° C. to decrease an adhesive strength of the self-peeling adhesive layer and removing the supporting substrate from the semiconductor chip mold with an attached supporting base material; and
- removing the adhesive film to obtain a semiconductor chip mold.

8. A method for manufacturing a semiconductor device comprising the steps of:
- adhering the adhesive film according to claim 3 to a supporting substrate such that the self-peeling adhesive layer is on the supporting substrate side of the adhesive film;
- mounting a semiconductor chip on the base material layer of the adhesive film;
- applying an encapsulating material to cover the semiconductor chip and the adhesive film and curing the encapsulating material at a temperature of 150° C. or less to form a semiconductor chip mold with an attached supporting base material;
- heating at a temperature over 150° C. to decrease an adhesive strength of the self-peeling adhesive layer and removing the supporting substrate from the semiconductor chip mold with an attached supporting base material; and
- removing the adhesive film to obtain a semiconductor chip mold.

9. A method for manufacturing a semiconductor device comprising the steps of:
- adhering the adhesive film according to claim 4 to a supporting substrate such that the self-peeling adhesive layer is on the supporting substrate side of the adhesive film;
- mounting a semiconductor chip on the base material layer of the adhesive film;
- applying an encapsulating material to cover the semiconductor chip and the adhesive film and curing the encapsulating material at a temperature of 150° C. or less to form a semiconductor chip mold with an attached supporting base material;
- heating at a temperature over 150° C. to decrease an adhesive strength of the self-peeling adhesive layer and removing the supporting substrate from the semiconductor chip mold with an attached supporting base material; and
- removing the adhesive film to obtain a semiconductor chip mold.

10. A method for manufacturing a semiconductor device comprising the steps of:
- adhering the adhesive film according to claim 5 to a supporting substrate such that the self-peeling adhesive layer is on the supporting substrate side of the adhesive film;
- mounting a semiconductor chip on the base material layer of the adhesive film;
- applying an encapsulating material to cover the semiconductor chip and the adhesive film and curing the encapsulating material at a temperature of 150° C. or less to form a semiconductor chip mold with an attached supporting base material;
- heating at a temperature over 150° C. to decrease an adhesive strength of the self-peeling adhesive layer and removing the supporting substrate from the semiconductor chip mold with an attached supporting base material; and
- removing the adhesive film to obtain a semiconductor chip mold.

* * * * *